United States Patent
Liu et al.

(10) Patent No.: US 10,269,852 B2
(45) Date of Patent: Apr. 23, 2019

(54) VERTICALLY INTEGRATED THREE-DIMENSIONAL CMOS IMAGE SENSORS (3D CIS) BONDED WITH CONTROL CIRCUIT SUBSTRATE

(71) Applicants: SEMICONDUCTOR MANUFACTURING INTERNATIONAL (SHANGHAI) CORPORATION, Shanghai (CN); NINGBO SEMICONDUCTOR INTERNATIONAL CORPORATION, Ningbo (CN)

(72) Inventors: Jerry Liu, Shanghai (CN); Phil Wu, Shanghai (CN); Herb He Huang, Shanghai (CN)

(73) Assignees: SEMICONDUCTOR MANUFACTURING INTERNATIONAL (SHANGHAI) CORPORATION, Shanghai (CN); NINGBO SEMICONDUCTOR INTERNATIONAL CORPORATION, Ningbo (CN)

( * ) Notice: Subject to any disclaimer, the term of this patent is extended or adjusted under 35 U.S.C. 154(b) by 92 days.

(21) Appl. No.: 14/751,134

(22) Filed: Jun. 26, 2015

(65) Prior Publication Data

US 2016/0020239 A1   Jan. 21, 2016

(30) Foreign Application Priority Data

Jul. 16, 2014   (CN) .......................... 2014 1 0339966

(51) Int. Cl.
*H01L 27/146* (2006.01)

(52) U.S. Cl.
CPC .... *H01L 27/14634* (2013.01); *H01L 27/1463* (2013.01); *H01L 27/1469* (2013.01); *H01L 27/14636* (2013.01); *H01L 27/14689* (2013.01); *H01L 2224/48091* (2013.01)

(58) Field of Classification Search
CPC ......... H01L 27/14647; H01L 27/14632; H01L 27/14687; H01L 27/14641
USPC ....... 257/292, 401, 431, 444, 616, 618, 461; 438/69, 70, 294, 459
See application file for complete search history.

(56) References Cited

U.S. PATENT DOCUMENTS

| | | | |
|---|---|---|---|
| 2002/0096730 A1* | 7/2002 | Tu ....................... | H01L 25/0657 257/433 |
| 2003/0030083 A1* | 2/2003 | Lee, II .............. | H01L 27/14603 257/292 |
| 2006/0146233 A1* | 7/2006 | Park .................. | H01L 27/14634 349/95 |

(Continued)

*Primary Examiner* — Changhyun Yi
(74) *Attorney, Agent, or Firm* — Anova Law Group, PLLC

(57) ABSTRACT

A device includes a first integrated circuit containing a photodiode and a first metal interconnect structure connected to the photodiode, and a second integrated circuit containing a transistor and a second metal interconnect structure connected to the transistor. The first integrated circuit and the second integrated circuit are connected together through the first metal interconnect structure and the second metal interconnect structure. Since no transistor is present around the photodiode, the photodiode has an increased photosensitive area and an improved fill factor, resulting in an increase of the quantum efficiency, higher integration and lower consumption of the image sensor.

11 Claims, 4 Drawing Sheets

(56) References Cited

U.S. PATENT DOCUMENTS

| | | | |
|---|---|---|---|
| 2009/0085135 A1* | 4/2009 | Bang | H01L 27/14632 |
| | | | 257/432 |
| 2009/0321118 A1* | 12/2009 | Kim | H01L 23/5389 |
| | | | 174/260 |
| 2010/0013907 A1* | 1/2010 | Lee | H01L 27/1469 |
| | | | 348/46 |
| 2011/0127630 A1* | 6/2011 | Lee | H01L 27/1463 |
| | | | 257/461 |
| 2013/0214426 A1* | 8/2013 | Zhao | H01L 24/17 |
| | | | 257/774 |
| 2013/0240962 A1* | 9/2013 | Wang | H01L 31/02002 |
| | | | 257/292 |
| 2013/0267089 A1* | 10/2013 | Maslyk | H01R 43/00 |
| | | | 438/637 |
| 2014/0035083 A1* | 2/2014 | Wan | H01L 27/14634 |
| | | | 257/432 |
| 2014/0175637 A1* | 6/2014 | Stuber | H01L 21/6835 |
| | | | 257/737 |
| 2014/0231887 A1* | 8/2014 | Chen | H01L 31/18 |
| | | | 257/291 |
| 2015/0155323 A1* | 6/2015 | Ahn | H01L 27/14616 |
| | | | 257/184 |
| 2015/0380383 A1* | 12/2015 | Gondcharton | H01L 25/50 |
| | | | 257/777 |

* cited by examiner

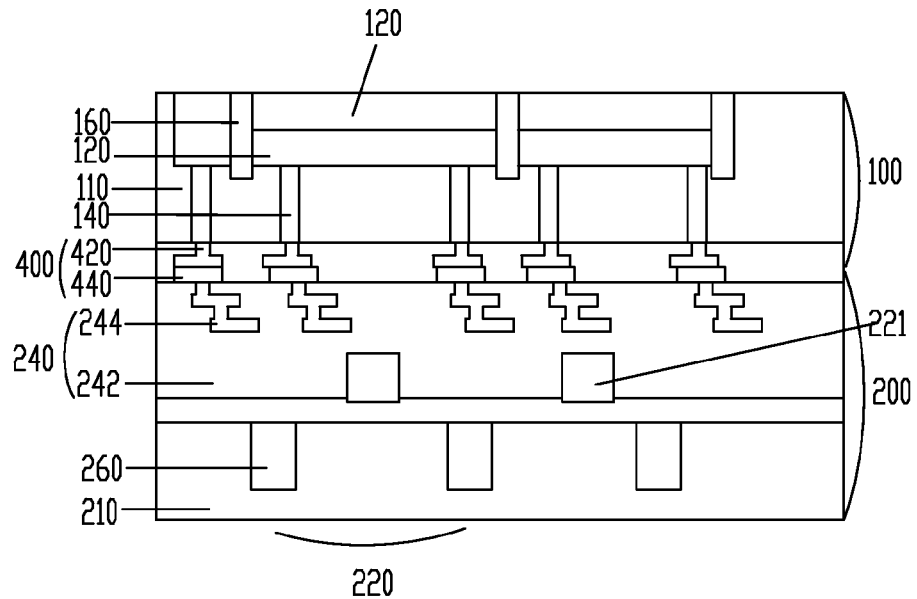

FIG. 1 form a first chip comprising a photodiode and a first metal interconnect structure connected to the photodiode, form a second chip comprising a transistor and a second metal interconnect structure connected to the transistor — 210 bond the first chip and the second chip together through the first metal interconnect structure and the second metal interconnect structure — 220

FIG. 2

VERTICALLY INTEGRATED THREE-DIMENSIONAL CMOS IMAGE SENSORS (3D CIS) BONDED WITH CONTROL CIRCUIT SUBSTRATE

CROSS-REFERENCES TO RELATED APPLICATIONS

This application claims priority to Chinese patent application No. 2014101339966.8, filed on Jul. 16, 2014, the content of which is incorporated herein by reference in its entirety.

BACKGROUND OF THE INVENTION

The present invention relates to the field of integrated circuits, and more particularly to a semiconductor device, and method of fabricating the semiconductor device including an image sensor.

An image sensor is able to receive information of an optical image and convert the information into an electric signal. An image sensor may be based on the principle of its implementation into a charge coupled device (commonly known as a CCD image sensor) and a CMOS image sensor, where the CMOS image sensor is based on complementary metal-oxide semiconductor (CMOS) manufacturing technology. Because a CMOS image sensor is fabricated using conventional CMOS manufacturing processes, it can be integrated with other peripheral circuits so that the CMOS image sensor has a broad range of applications.

According to different positions of the light receiving component, CMOS image sensors can be divided into front-illuminated CMOS image sensors and back-illuminated CMOS image sensors. In a front-illuminated CMOS image sensor, the photodiode is disposed behind the transistor circuit so that an amount of incident light is blocked by the transistor circuit, reducing the quantum conversion efficiency. Back-illuminated CMOS image sensors have advantages over front-illuminated CMOS image sensors in that the internal structure is reversed so that light enters the back side of the CMOS image sensor can reach directly the photodiode. Light is affected by the structure between the microlens and the photodiode and the thickness of the structure so that the effectiveness of the received light can be improved.

Conventional front-illuminated CMOS image sensors and back-illuminated image sensors have the photodiode and the transistor circuit integrated on the same chip, and each photodiode together with 1 to 5 transistors form a pixel as the basic unit of the image forming unit. However, the transistors hinder light absorption of the photodiode so that light receiving efficiency is reduced, leading to reduced quantum conversion efficiency of the photodiode.

In view of the foregoing, there is a need for a novel semiconductor device and method for manufacturing the semiconductor device that can overcome the deficiencies of the prior art.

BRIEF SUMMARY OF THE INVENTION

Embodiments of the present invention provide a device, which includes a first integrated circuit including a photodiode and a first metal interconnect structure connected to the photodiode, and a second integrated circuit including a transistor and a second metal interconnect structure connected to the transistor. The first integrated circuit and the second integrated circuit are connected together through the first metal interconnect structure and the second metal interconnect structure.

In one embodiment, the first integrated circuit includes a first substrate having a first surface and a second surface opposite the first surface. The photodiode includes a photosensitive surface formed on the first surface, and the first metal interconnect structure extends to the second surface of the first substrate.

In one embodiment, the second integrated circuit includes a second substrate and a dielectric layer. The transistor is disposed in the second substrate, and the second metal interconnect structure is disposed in the dielectric layer.

In one embodiment, the device may further include a connection layer disposed between the first integrated circuit and the second integrated circuit, the connection layer includes a first metal pad connected to the first metal interconnect structure and a second metal pad connected to the second metal interconnect structure.

In one embodiment, the device may also include multiple diodes disposed in the first substrate, each of the diodes is identical to the photodiode, and multiple first isolation trenches disposed in the first substrate, with each of the first isolation trenches disposed between two diodes. The device also includes multiple unit regions in the second substrate, each of the unit regions including one to five switch elements, each switch element being identical to the transistor; and multiple second isolation trenches in the second substrate, each of the second isolation trenches disposed between two unit regions. The device further includes an interconnect layer on the second substrate, the interconnect layer including the dielectric layer and the second metal interconnect structure in the dielectric layer. The diodes in the first integrated circuit and the unit regions in the second integrated circuit form an array of pixels.

Embodiments of the present invention also provide a method of manufacturing a semiconductor device. The method includes forming a first integrated circuit including a photodiode and a first metal interconnect structure connected to the photodiode, forming a second integrated circuit including a transistor and a second metal interconnect structure connected to the transistor, and bonding together the first integrated circuit and the second integrated circuit through the first metal interconnect structure and the second metal interconnect structure.

In one embodiment, forming the first integrated circuit includes providing a first substrate having a first surface and a second surface opposite the first surface, forming a photosensitive surface of the photodiode on the first surface of the first substrate by ion implantation, and forming the first metal interconnect structure having an end connected to the photodiode and an opposite end extending to the second surface of the first substrate.

In one embodiment, forming the first metal interconnect structure includes forming a sacrificial substrate on the first surface of the first substrate, turning over the first substrate so that the second surface faces upward, etching the second surface along a location of the to-be formed first metal interconnect structure to form a trench in contact with the photodiode, and filling the trench with a metal material.

In one embodiment, the sacrificial substrate is formed on the first surface of the first substrate through a bonding process.

In one embodiment, the method further includes, prior to etching the second surface, thinning the second surface of the first substrate.

In one embodiment, the method further includes removing the sacrificial substrate after bonding together the first integrated circuit and the second integrated circuit.

In one embodiment, forming the second integrated circuit includes providing a second substrate, forming the transistor in the second substrate, forming an interconnect layer on the second substrate covering the transistor. The interconnect layer includes a dielectric layer, and the second metal interconnect layer is disposed in the dielectric layer.

In one embodiment, forming the interconnect layer includes forming the dielectric layer on the second substrate, etching the first dielectric layer to form a through-hole, and filling the though-hole with a metal material.

In one embodiment, bonding the first integrated circuit and the second integrated circuit together includes forming a first metal pad on the first integrated circuit connecting to the first metal interconnect structure, forming a second metal pad on the second integrated circuit connecting to the second metal interconnect structure, and connecting the first metal pad and the second metal pad, the connected first and second metal pads forming a connecting layer.

In one embodiment, the first integrated circuit includes multiple diodes, each of the diodes is identical to the above-described photodiode. The first metal interconnect structure includes multiple first interconnect elements. The second first integrated circuit includes multiple unit regions, each of the unit regions includes one to five electronic switches, and each of the electronic switches is identical to the above-described transistor. Forming the first integrated circuit includes providing a first substrate having a first surface and a second surface opposite the first surface, forming multiple first trenches in the first surface of the first substrate, forming a diode between two adjacent trenches, and forming the multiple first metal interconnect elements, each of the first metal interconnect elements has an end connected to one of the diodes and an opposite end extending to the second surface of the first substrate. Forming the second integrated circuit includes providing a second substrate, forming multiple second trenches in the second substrate, forming a unit region between two adjacent second trenches, and forming an interconnect layer on the second substrate, the interconnect layer including a first dielectric layer and the second metal interconnect structure in the first dielectric layer.

Embodiments of the present invention also provide an image sensor. The image sensor comprises the above-described device, a transparent electrode, a filter, and a glass substrate that are sequentially mounted on a printed circuit board. The photodiode of the first integrated circuit includes a photosensitive surface connected to the transparent electrode, and the second integrated circuit includes a back surface facing away from the first integrated circuit and connected to the printed circuit board.

The following description, together with the accompanying drawings, will provide a better understanding of the nature and advantages of the claimed invention.

BRIEF DESCRIPTION OF THE DRAWINGS

FIG. 1 is a cross-sectional view of a semiconductor device structure according to an embodiment of the present invention;

FIG. 2 is a simplified flow chart of a method for manufacturing a semiconductor device according to an embodiment of the present invention;

DETAILED DESCRIPTION OF THE INVENTION

Figure 3:
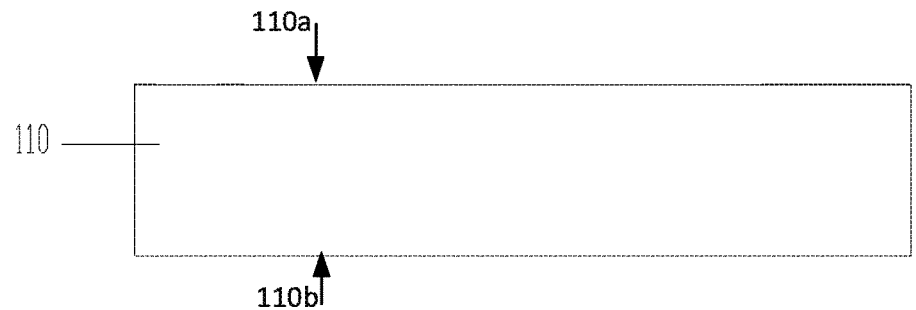
FIG. 3 is a cross-sectional view of a first substrate for manufacturing an integrated circuit according to an embodiment of the present invention.

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It should be understood that the drawings are not drawn to scale, and similar reference numbers are used for representing similar elements. Embodiments of the invention are described herein with reference to cross-section illustrations that are schematic illustrations of idealized embodiments (and intermediate structures) of the invention. The thickness of layers and regions in the drawings may be exaggerated relative to each other for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

It will be understood that, when an element or layer is referred to as "on," "disposed on," "adjacent to," "connected to," or "coupled to" another element or layer, it can be disposed directly on the other element or layer, adjacent to, connected or coupled to the other element or layer, or intervening elements or layers may also be present. In contrast, when an element is referred to as being "directly on," directly disposed on," "directly connected to," or "directly coupled to" another element or layer, there are no intervening elements or layers present between them. It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Relative terms such as "under," "below," "underneath," "over," "on," "above," "bottom," and "top" are used herein to described a relationship of one element, layer or region to another element, layer or region as illustrated in the figures.

It will be understood that these terms are intended to encompass different orientations of the structure in addition to the orientation depicted in the figures. For example, if the device shown in the figures is flipped (turned over), the description of an element being "below" or "underneath" another element would then be oriented as "above" the other element. Therefore, the term "below," "under," or "underneath" can encompass both orientations of the device. Because devices or components of embodiments of the present invention can be positioned in a number of different orientations (e.g., rotated 90 degrees or at other orientations), the relative terms should be interpreted accordingly.

The terms "a", "an" and "the" may include singular and plural references. It will be further understood that the terms "comprising", "including", having" and variants thereof, when used in this specification, specify the presence of stated features, steps, operations, elements, and/or components, but do not, preclude the presence or addition of one or more other features, steps, operations, elements, components, and/or groups thereof. Furthermore, as used herein, the words "and/or" may refer to and encompass any possible combinations of one or more of the associated listed items.

The use of the terms first, second, etc. do not denote any order, but rather the terms first, second, etc. are used to distinguish one element from another. Furthermore, the use of the terms a, an, etc. does not denote a limitation of quantity, but rather denote the presence of at least one of the referenced items.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The term "substrate" may include any structure having an exposed surface with which to form an integrated circuit. The term "substrate" is understood to include semiconductor wafers and is also used to refer to semiconductor structures during processing and may include other layers that have been fabricated thereupon. A "substrate" may include doped and undoped semiconductor wafers, epitaxial semiconductor layers, as well as other semiconductor structures. The term "chip" is used to refer to an integrated circuit device including logic devices, memory devices, various types of photodiodes, and various types of transistors.

As described in the background section, conventional image sensors have problems of low receiving light efficiency and low quantum conversion efficiency. The inventors studied the above problems and proposed a novel integrated device and method of manufacturing the same. According to the present invention, an integrated device includes a first chip (integrated circuit) 100 containing a photodiode 120 and a first metal interconnect structure 140 connected to photodiode 120, a second chip (integrated circuit) 200 containing a transistor 221 and a second metal interconnect structure 244 connected to transistor 221. First chip 100 and second chip 200 are connected to each other through first metal interconnect structure 140 and second metal interconnect structure 244. Since no transistor structure is present around the photodiode in the first chip, the effective photosensitive area and the fill factor of the photodiode have increased, thereby increasing the quantum efficiency of the image sensor. At the same time, the integrated circuit can increase the transistor integration, thus reducing the power consumption of the image sensor.

In a preferred embodiment of the above-described integrated device, first chip 100 includes a first substrate 110 having a first surface and a second surface, photodiode 120 having a photosensitive surface formed on the first surface, first metal interconnect structure 140 connected to photodiode 120 and extended to the second surface of the first chip. Second chip 200 includes a second substrate 210 and a first dielectric layer 242, transistor 221 disposed in second substrate 210, a second metal interconnect structure 244 disposed in first dielectric layer 242. First dielectric layer 242 and second metal interconnect structure 244 form an interconnect layer 240.

In a preferred embodiment, first metal interconnect structure 140 and second metal interconnect structure 244 may be connected to each other through a connection layer 400. More preferably, connecting layer 400 includes a first metal pad 420 configured to connect to first metal interconnect structure 140 and a second metal pad 440 configured to connect to second metal interconnect structure 244. The height or thickness of connecting layer 400 can be set according to processing requirements to achieve the best connection. Preferably, the height or thickness of connection layer 400 is about $\frac{1}{10}$ to $\frac{1}{3}$ of the height or thickness of first chip 100.

In the embodiment, first chip 100 includes first substrate 110, multiple photodiodes 120 disposed in first substrate 110, multiple first isolation trenches 160, each of the multiple first isolation trenches is disposed between two adjacent photodiodes. Second chip 200 includes second substrate 210, multiple unit regions 220 in second substrate 210, each of the unit regions includes 1 to 5 transistors 221. Second chip 200 also includes multiple second isolation trenches 260 disposed in second substrate 210, each of the multiple second isolation trenches is disposed between two adjacent unit regions 220, and an interconnect layer 240 disposed on second substrate 210. Interconnect layer 240 includes a first dielectric layer 242 and a second metal interconnect structure 244 disposed in first dielectric layer 242. Each photodiode 120 in first chip 100 is connected to a corresponding unit region 220 in second chip 200 to form a pixel unit. It should be noted that the photosensitive surface of photodiodes 120 is on an exposed surface of first substrate 110, and first chip further includes multiple pins (not shown) configured to connect to a peripheral circuit.

The number and types of transistors 221 in a unit region 220 can be chosen based on application requirements of the image sensor. In an embodiment, unit region 220 includes a transfer transistor, a source follower transistor, a reset transistor, and a select transistor. In the meantime, pixel information generated in photodiode 120 is transferred through first metal interconnect structure 140, connection layer 400 and second metal interconnect structure 244, to a source of the transfer transistor, a drain of the transfer transistor and the source follower transistor, at the same time, the source follower transistor is sequentially connected to the reset transistor and the select transistor. The reset transistor is used to set the photodiode to an initial state before collecting pixel information, and the select transistor determines whether to transmit the pixel information of the photodiode to an external circuit for further processing.

Embodiments of the present invention also provide a method of manufacturing a device. Referring to FIG. 1 and FIG. 2, the method includes forming a first chip 100 comprising a photodiode 120 and a first metal interconnect structure 140. The method also includes forming a second chip 200 comprising a transistor 221 and a second metal interconnect structure 244 (step 210). Photodiode 120 is connected to first metal interconnect structure 140 in first chip 100, and transistor 221 is connected to second metal interconnect structure 244 in second chip 200. The method also includes bonding first chip 100 and second chip 200 together through first metal interconnect structure 140 and second metal interconnect structure 244 (step 220). In accordance with the present invention, the photodiode and the first metal interconnect structure are provide in the first chip, whereas the transistor is provided in the second chip. Thus, no transistor is present around the photodiode, thereby increasing the effective photosensitive area of the photodiode and the quantum efficiency of the image sensor.

The present invention will be described in detail according to an exemplary embodiment. However, it is to be understood that the embodiment can be implemented in any number of ways, and thus is not limiting. It is appreciated that the exemplary embodiment is provided to fully describe the concept of the invention. The thickness of layers and regions in the drawings may be exaggerated relative to each other for clarity. In the drawings, the same reference numerals may denote the same components, and their description will not be repeated for the sake of brevity.

Figure 4:
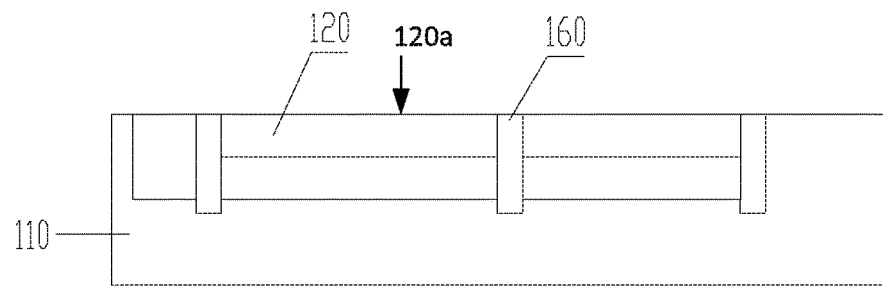
FIG. 4 is a cross-sectional view of a photodiode formed in the first substrate of FIG. 3.
Figure 5:
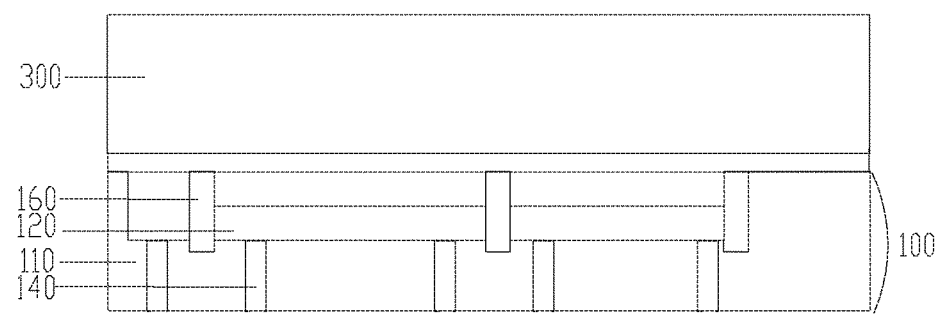
FIG. 5 is a cross-sectional view of a first metal interconnect structure connecting with the photodiode formed in the first substrate of FIG. 4.
Figure 6:
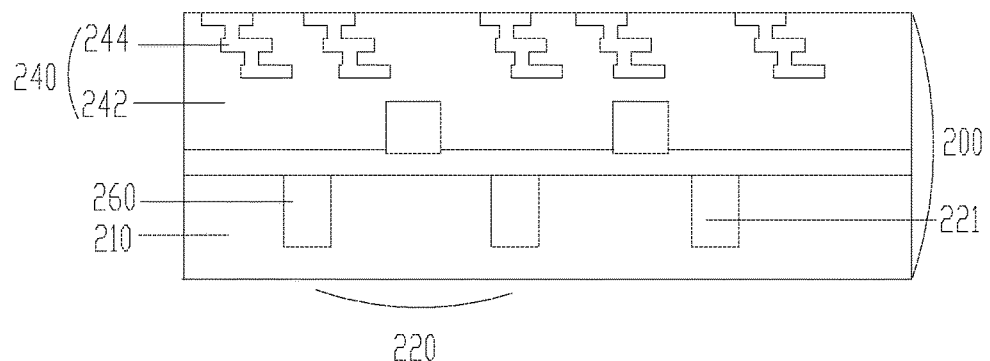
FIG. 6 is a cross-sectional view of a structure of a second integrated circuit according to an embodiment of the present invention.

FIGS. 3-8 are cross-sectional views illustrating the different stages for manufacturing a semiconductor device. In accordance with the present invention, a method for manufacturing a semiconductor device includes forming a first chip 100 comprising a photodiode 120 and a first metal interconnect structure 140, as shown in FIG. 5. The method also includes forming a second chip 200 comprising a transistor 221 and a second metal interconnect structure 244, as shown in FIG. 6.

In an embodiment, the method of forming first chip 100 may include the following steps: provide a first substrate 110 having a first surface 110a and a second surface 110b opposite the first surface; performing an ion implantation into first surface 110a to form a photosensitive surface of a photodiode 120; forming a first metal interconnect structure 140 that is connected to photodiode 120 and extends to the second surface of first substrate 110. The manufacturing method of first chip 100 will be described in more detail below.

Specifically, a first substrate 100 is provided, as shown in FIG. 3. First substrate may be a monocrystalline silicon (Si) substrate, a monocrystalline germanium (Ge) substrate, silicon germanium (SiGe) substrate or carbonized silicon (SiC) substrate, or a silicon on insulator (SOI), germanium on insulator (GeOI), or substrate including other materials such as gallium arsenide and other group III-V compounds.

An ion implantation is performed into the first surface of first substrate 100 to form a photodiode 120 having an exposed photosensitive surface 120a, as shown in FIG. 4. Photodiode 120 can be a typical photodiode, such as a PN photodiode, a PIN photodiode or an avalanche photodiode.

In another embodiment, forming a PN photodiode through a plasma doping process may include: performing an ion implantation with N-type dopants into first substrate 110 to form an N-type doped region, the N-type dopants may have a concentration of $1.0 \times 10^{16}$ to $1.0 \times 10^{21}$ atoms/cm$^3$, and an implant energy of 100 to 400 KeV; and performing an ion implantation with P-type dopants into the N-type doped region to form a P-type doped region, the P-type dopants may have a concentration of $1.0 \times 10^{18}$ to $1.0 \times 10^{23}$ atoms/cm$^3$, and an implant energy of 300 to 600 KeV. Note that, prior to forming the photodiodes, multiple isolation trenches 160 are first formed in the first surface of first substrate 110, and the photodiodes are then formed between adjacent isolation trenches 160.

After performing the ion implantation into first substrate to form a photodiode having an exposed photosensitive surface, the method further includes forming a first metal interconnect structure 140 that connects to photodiode 120 and extends to the second surface of first substrate 110. In other words, first metal interconnect structure 140 includes a first end connecting to photodiode 120 and a second end opposite to the first end and extending to the second surface of first substrate 110. In a preferred embodiment, the method may include: forming a sacrificial substrate 300 on the first surface of first substrate 110, reversing (turning over) first substrate 110 so that the second surface is face-up and the first surface is face-down, performing an etching process in the second surface to remove a portion of first substrate 110 to form a trench, which corresponds to the to-be formed first metal interconnect structure 140; and then filling the trench with a metal material to form first metal interconnect structure 140.

In an embodiment, sacrificial substrate 300 can also be formed on first substrate 110 using a bonding process. The bonding process enables a temporarily connection between first substrate 110 and sacrificial substrate 300, and sacrificial substrate 300 is then removed after the first chip and second chip are bonded together. Note that, prior to connecting first substrate 110 to sacrificial substrate 300, the method may include cleaning the first surface of first substrate to remove surface defects, such as organic residues.

Prior to forming the trench, the method may include performing a thinning process on the second surface of first substrate 110 to obtain a suitable thickness of first substrate 110. The thinning process may be a chemical mechanical polishing, grinding, or etching process to remove a thickness portion of the second surface of first substrate 110. It should be noted that sacrificial substrate 300 is removed after first chip 100 and second chip 200 are connected to each other.

It is appreciated that second chip 200 can be formed concurrently with first chip 100. Referring to FIG. 6, the method of forming the second chip may include the following steps: providing a second substrate 210; forming a transistor 221 in second substrate 210; and forming an interconnect layer 240 on second substrate 210. Interconnect layer 240 includes a first dielectric layer 242 and a second metal interconnect structure 244 that is disposed in first dielectric layer 242 and configured to connect to transistor 221. In a preferred embodiment, forming interconnect layer 240 includes: forming a first dielectric layer 242 on a first surface (the transistor is formed thereon) of second substrate 210; etching through first dielectric layer 242 to form a through-hole; and filling the through-hole with a metal material to form the second interconnect material.

The number of unit regions 220, and the number and types of transistors in a unit region 220 depend on application requirements of the image sensor. In an embodiment, unit region 220 includes a transfer transistor, a source follower transistor, a reset transistor, and a select transistor. Transistor 221 and second metal interconnect structure may be formed using conventional process techniques that are well-known in the art, so that a detailed description is omitted herein for the sake of brevity. It is noted that first dielectric layer 242 may include multiple layers, second interconnect metal structure 244 may be formed in the multiple layers of first dielectric layer 242.

Figure 7:
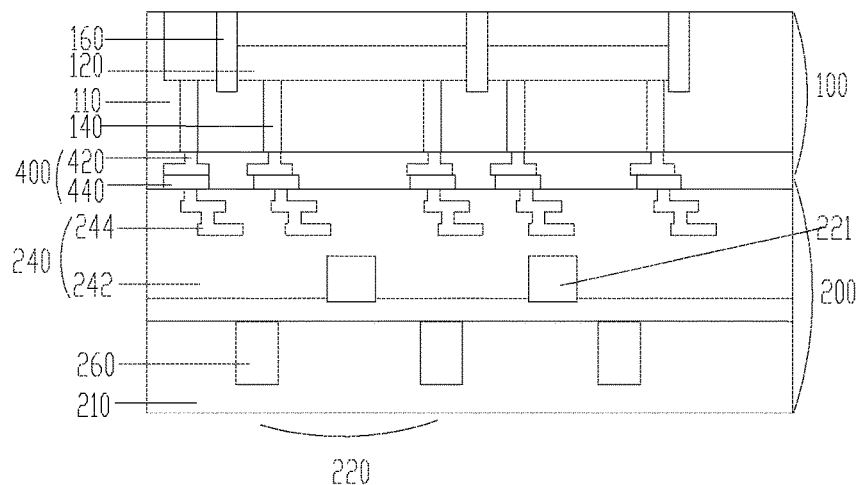
FIG. 7 is a cross-sectional view of a structure that connects the first integrated circuit of FIG. 5 with the second integrated circuit of FIG. 6 according to an embodiment of the present invention.

After first chip 100 and second chip 200 are formed, the method further includes bonding first chip 100 and second chip 200 together through first metal interconnect structure 140 and second metal interconnect structure 244 to form a device, as shown in FIG. 7. In a preferred embodiment, first chip 100 and second chip 200 are connected through connection layer 400. The method of bonding together first chip 100 and second chip 200 includes: forming on the surface of first chip a first metal pad 420 configured to connect to first interconnect structure 140; forming on the surface of second chip 200 a second metal pad 440 configured to connect to second metal interconnect structure 244; and connecting first chip 100 and second chip 200 through first metal pad 420 and second pad 440. First metal pad 420 and second metal pad 440 form connection layer 400. First metal pad 420 and second metal pad 440 are formed of a metal commonly used in a bonding process, such as Cu, Sn, or a combination thereof. First metal pad 420 and second metal pad 440 can be formed using a chemical vapor deposition, sputtering and evaporation process, or other suitable processes.

Figure 8A:
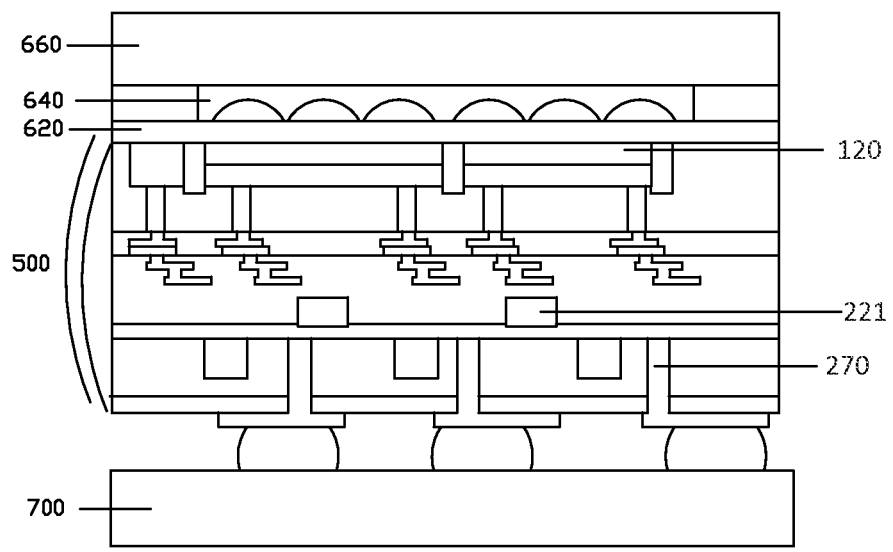
FIGS. 8A and 8B are cross-sectional views of an image sensor according to an embodiment of the present invention.
Figure 8B:
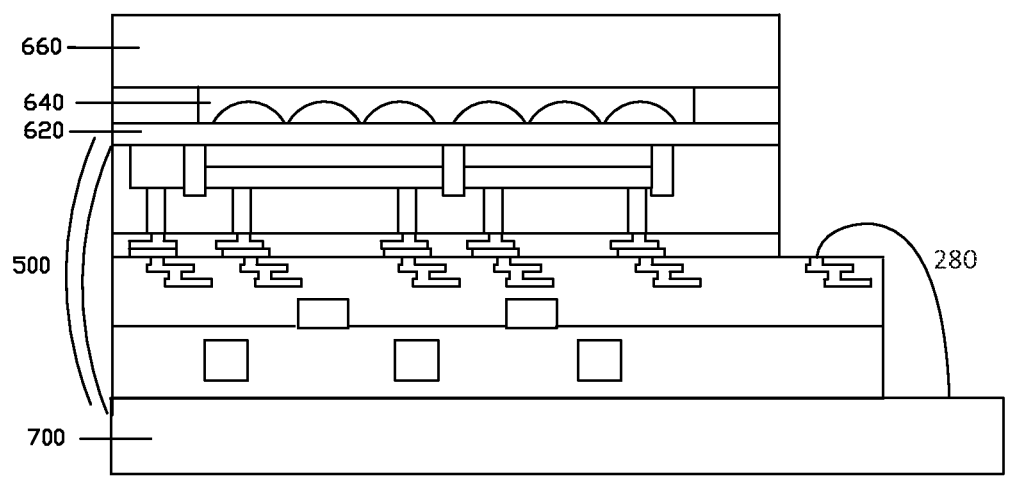

In an embodiment, first chip 100 and second chip 200 may be bonded using a thermo-compression bonding process. The thermo-compression bonding process is carried out at a temperature in the range between 300° C. to 500° C., under a pressure force in the range between 1 kN and 100 kN, and a duration in the range between 5 minutes and 60 minutes. It is noted that, prior to bonding, a cleaning process is carried out to clean the surface of the first chip and second chip to remove surface defects, such as organic residues and the like Embodiments of the present invention also provide an image sensor. Referring to FIGS. 8A and 8B, an image sensor includes a printer circuit board 700, a device 500, a transparent electrode 620, a filter 640, and a glass substrate 660. Device 500 may be a device formed by bonding first chip 100 and second chip 200 together in the manner described in sections above. Photodiode 120 in first chip 100 is connected to transparent electrode 620, and transistor 221 in second chip 200 is connected to printed circuit board 700. Referring to FIG. 8A, second chip 200 is bonded to printed circuit board 700 through through-silicon vias 270. Referring to FIG. 8B, second chip 200 is bonded to printed circuit board 700 through wire bonding 280. The effective photosensitive area and the fill factor of the thus formed image sensor have increased, thereby improving the quantum conversion efficiency of the image sensor.

From the above description, it can be seen that embodiments of the present invention provide the following advantages: forming a photodiode and a first metal interconnect structure connected to the photodiode in a first chip, forming a transistor in a second chip. Since no transistors are formed around the photodiode, the effective photosensitive area of the photodiode and the fill factor will be increased, thereby increasing the quantum efficiency of the image sensor.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description. For example, although two photodiodes and two transistors are shown, it is understood that the number of photodiodes and transistors can be more or fewer than two in other embodiments. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A method of manufacturing a chip comprising:
providing a first substrate having a first surface and a second surface opposite the first surface;
forming an exposed photosensitive surface of a photodiode on the first surface of the first substrate by ion implantation;
forming a first metal interconnect structure having an end connected to the photodiode and an opposite end extending to the second surface of the first substrate and having a surface flush with the second surface;
forming a second integrated circuit including a transistor and a second metal interconnect structure connected to the transistor, the second metal interconnect structure having a surface flush with a surface the second integrated circuit;
cleaning a second surface of the first metal interconnect structure;
forming a first metal pad on the cleaned second surface of the first metal interconnect structure;
cleaning the surface of the second metal interconnect structure;
forming a second metal pad on the cleaned surface of the second metal interconnect structure; and
electrically connecting a first integrated circuit and the second integrated circuit through the first metal pad and the second metal pad, thereby forming a connection layer having a thickness in a range between $1/10$ and $1/3$ of a thickness of the first integrated circuit.

2. The method of claim 1, wherein forming the first metal interconnect structure comprises:
forming a sacrificial substrate on the first surface of the first substrate;
turning over the first substrate so that the second surface faces upward;
etching the second surface along a location of the to-be formed first metal interconnect structure to form a trench in contact with the photodiode; and
filling the trench with a metal material.

3. The method of claim 2, wherein the sacrificial substrate is formed on the first surface of the first substrate through a bonding process.

4. The method of claim 2, further comprising, prior to etching the second surface, thinning the second surface of the first substrate.

5. The method of claim 2, further comprising, after bonding together the first integrated circuit and the second integrated circuit, removing the sacrificial substrate.

6. The method of claim 1, wherein forming the second integrated circuit comprises:
providing a second substrate;

forming the transistor in the second substrate;
forming an interconnect layer on the second substrate covering the transistor; the interconnect layer comprising a dielectric layer and the second metal interconnect layer in the dielectric layer.

7. The method of claim 1, wherein the first integrated circuit comprises a plurality of diodes, each of the diodes being identical to the photodiode, the first metal interconnect structure comprises a plurality of first interconnect elements, and the second first integrated circuit comprises a plurality of unit regions, each of the unit regions comprising one to five electronic switches, each of the electronic switches being identical to the transistor, wherein:
   forming the first integrated circuit comprises:
      forming a plurality of first trenches in the first surface of the first substrate;
      forming a diode between two adjacent trenches;
      forming the plurality of first metal interconnect elements, each of the first metal interconnect elements having an end connected to one of the diodes and an opposite end extending to the second surface of the first substrate;
   forming the second integrated circuit comprises:
      providing a second substrate;
      forming a plurality of second trenches in the second substrate;
      forming a unit region between two adjacent second trenches; and
      forming an interconnect layer on the second substrate, the interconnect layer comprising a first dielectric layer and the second metal interconnect structure in the first dielectric layer.

8. A method of manufacturing a semiconductor device, the method comprising:
   providing a substrate having a first surface and a second surface;
   forming a photodiode having an exposed photosensitive surface on the first surface of the substrate;
   forming a first metal interconnect structure having an end connected to the photodiode and an opposite end extending to the second surface of the substrate to form a first integrated circuit, the opposite end having a surface flush with the second surface of the substrate;
   forming a first metal pad on the surface of the opposite end of the first metal interconnect structure;
   forming a second integrated circuit including a transistor and a second metal interconnect structure connected to the transistor, the second metal interconnect structure having a surface flush with a surface of the second integrated circuit;
   forming a second metal pad on the surface of the second metal interconnect structure;
   electrically connecting the first integrated circuit and the second integrated circuit through the first metal pad and the second metal pad using a thermos-compression process.

9. The method of claim 8, wherein forming the photodiode comprises:
   performing a first ion implantation with an N-type dopant having a concentration of $1.0 \times 10^{16}$ to $1.0 \times 10^{21}$ atoms/cm$^3$ and an energy of 100 keV to 400 keV to form an N-type doped region;
   performing a second ion implantation with a P-type dopant having a concentration of $1.0 \times 10^{18}$ to $1.0 \times 10^{23}$ atoms/cm$^3$ and an energy of 300 keV to 600 keV into the N-type doped region to form a P-type doped region.

10. The method of claim 9, further comprising, prior to forming the photodiode: forming an isolation trench in the first surface of the substrate; and the photodiode is formed adjacent to the isolation trench.

11. The method of claim 8, wherein the thermos-compression process is performed at a temperature in a range between 300 degrees Celsius and 500 degrees Celsius, with a pressure force in a range between 1 kN and 100 kN, and a time duration in a range between 5 minutes and 60 minutes.

* * * * *